(12) United States Patent
Trygubova

(10) Patent No.: US 11,812,584 B2
(45) Date of Patent: Nov. 7, 2023

(54) HEAT SPREADER DEVICE

(71) Applicant: DISH TECHNOLOGIES L.L.C., Englewood, CO (US)

(72) Inventor: Svitlana Trygubova, Lakewood, CO (US)

(73) Assignee: DISH Technologies L.L.C., Englewood, CO (US)

( * ) Notice: Subject to any disclaimer, the term of this patent is extended or adjusted under 35 U.S.C. 154(b) by 92 days.

(21) Appl. No.: 16/896,616

(22) Filed: Jun. 9, 2020

(65) Prior Publication Data

US 2020/0305304 A1 Sep. 24, 2020

Related U.S. Application Data

(62) Division of application No. 15/729,866, filed on Oct. 11, 2017, now Pat. No. 10,721,840.

(51) Int. Cl.
| H05K 7/20 | (2006.01) |
| F28F 9/00 | (2006.01) |
| F28F 3/00 | (2006.01) |
| H05K 5/00 | (2006.01) |

(52) U.S. Cl.
CPC ............ H05K 7/2049 (2013.01); F28F 3/00 (2013.01); F28F 9/002 (2013.01); H05K 5/0004 (2013.01)

(58) Field of Classification Search
CPC .......... F28F 3/00; F28F 9/002; H05K 5/0004; H05K 7/2049
See application file for complete search history.

(56) References Cited

U.S. PATENT DOCUMENTS

| 4,333,101 A | 6/1982 | York |
| 4,530,003 A | 7/1985 | Blair et al. |
| 4,710,852 A | 12/1987 | Keen |
| 4,914,551 A | 4/1990 | Anschel et al. |

(Continued)

FOREIGN PATENT DOCUMENTS

CN 102651354 B * 6/2015

OTHER PUBLICATIONS

EPO App Serial No. 18780273.1, Response to Rule 161 Communication, dated Oct. 21, 2020, received by Applicant Oct. 28, 2020.

(Continued)

*Primary Examiner* — Minh N Trinh
(74) *Attorney, Agent, or Firm* — Wash Park IP Ltd.; John T. Kennedy

(57) ABSTRACT

A device for transferring heat from a device component to an environment includes a heat plate connected to a spring. A first fastener attaches the spring to the heat plate at a first location. A second fastener, such as a rivet, attaches the spring to the heat plate at each of a second and a third location. The second fastener includes a tab on and extending above the heat plate and corresponding tab slot on the spring. The spring is riveted to the heat plate at the first location and a second spring member accepts the tab at each of the second location and the third location. Ribs on a top surface of spring facilitate thermal coupling of the spring to the component when the device is assembled. One or more spring curvatures facilitate vertical deflection and horizontal extension of the spring during device assembly.

20 Claims, 10 Drawing Sheets

(56) References Cited

U.S. PATENT DOCUMENTS

| | | |
|---|---|---|
| 5,287,247 A | 2/1994 | Smits et al. |
| 5,367,196 A | 11/1994 | Mahulikar et al. |
| 5,801,330 A | 9/1998 | Gademann et al. |
| 5,917,701 A | 6/1999 | Solberg |
| 5,940,271 A | 8/1999 | Mertol |
| 5,977,622 A | 11/1999 | Mertol |
| 6,049,469 A | 4/2000 | Hood et al. |
| 6,182,958 B1 | 2/2001 | Sidone et al. |
| 6,212,074 B1 | 4/2001 | Gonsalves et al. |
| 6,226,184 B1 | 5/2001 | Stolz et al. |
| 6,251,707 B1 | 6/2001 | Bernier et al. |
| 6,462,951 B2 | 10/2002 | Letourneau |
| 6,706,563 B2 | 3/2004 | Shim et al. |
| 6,791,183 B2 | 9/2004 | Kanelis |
| 6,806,567 B2 | 10/2004 | Hembree |
| 7,130,193 B2 | 10/2006 | Hirafuji et al. |
| 7,170,750 B2 * | 1/2007 | Tanaka ............... H01L 23/4006 165/185 |
| 7,203,065 B1 | 4/2007 | Sin Yan Too |
| 7,315,445 B2 | 1/2008 | Kirby et al. |
| 7,388,747 B2 * | 6/2008 | Yang ............... H01L 23/427 165/80.4 |
| 7,641,505 B2 | 1/2010 | Ma |
| 7,883,357 B2 | 2/2011 | Lin et al. |
| 8,154,880 B1 | 4/2012 | Bicknell |
| 8,363,411 B2 | 1/2013 | Stephens et al. |
| 8,544,745 B2 | 10/2013 | Mullins et al. |
| 8,766,093 B2 | 7/2014 | Lee et al. |
| 8,902,588 B2 | 12/2014 | Ritter et al. |
| 8,947,881 B2 | 2/2015 | Aspas et al. |
| 10,721,840 B2 * | 7/2020 | Trygubova ............ F28F 9/002 |
| 11,229,114 B2 | 1/2022 | Eto |
| 2004/0052052 A1 | 3/2004 | Rivera |
| 2004/0201964 A1 | 10/2004 | Sigl et al. |
| 2004/0207985 A1 | 10/2004 | Delano et al. |
| 2005/0248923 A1 | 11/2005 | Hsu |
| 2006/0087816 A1 | 4/2006 | Ewes et al. |
| 2006/0187645 A1 | 8/2006 | Numata |
| 2006/0215357 A1 | 9/2006 | Green et al. |
| 2006/0215368 A1 | 9/2006 | Tsai |
| 2007/0030656 A1 | 2/2007 | Ross et al. |
| 2007/0146990 A1 | 6/2007 | Hsieh |
| 2007/0146996 A1 | 6/2007 | Herring et al. |
| 2008/0053640 A1 | 3/2008 | Mok |
| 2008/0291638 A1 | 11/2008 | Ma et al. |
| 2010/0027220 A1 | 2/2010 | Hughes et al. |
| 2010/0097768 A1 | 4/2010 | Ishii et al. |
| 2013/0033823 A1 | 2/2013 | Nagashima et al. |
| 2013/0063895 A1 | 3/2013 | Ritter et al. |
| 2013/0141866 A1 | 6/2013 | Refai-Ahmed |
| 2014/0022733 A1 | 1/2014 | Lim et al. |
| 2014/0146479 A1 | 5/2014 | Kilroy et al. |
| 2014/0239488 A1 | 8/2014 | Kobayashi et al. |
| 2014/0293546 A1 | 10/2014 | Wu |
| 2014/0376187 A1 | 12/2014 | Baba et al. |
| 2015/0230363 A1 | 8/2015 | Dernier |
| 2015/0268704 A1 | 9/2015 | Chiriac et al. |
| 2017/0196121 A1 | 7/2017 | Trygubova et al. |
| 2020/0305304 A1 * | 9/2020 | Trygubova ........... H05K 7/2049 |
| 2020/0359525 A1 | 11/2020 | Eto |

OTHER PUBLICATIONS

PCT Application Serial No. PCT/US18/50372, "International Preliminary Report on Patentability", dated Jul. 3, 2018 (Available in parent application file, U.S. Appl. No. 15/729,866).

PCT Application Serial No. PCT/US18/50372, "International Search Report and Written Opinion", dated Jan. 30, 2017 (Available in parent application file, U.S. Appl. No. 15/729,866).

EPO Application No. 18780-273.1, Communication per Article 67(3) EPC—Publication of Application, dated Jul. 22, 2020.

U.S. Appl. No. 16/896,616, Non-final Office Action, dated Jun. 6, 2022.

EPO Application Serial No. 18780273.1, 1st Examination Report, dated May 30, 2022.

EPO App Serial No. 18780273.1, Response to Examination Report, dated Sep. 27, 2022.

U.S. Appl. No. 17/446,031, Final Office Action, dated Mar. 6, 2023.

U.S. Appl. No. 17/446,031, Non-Final Office Action, dated Nov. 14, 2022.

U.S. Appl. No. 17/446,031, Response to Non-Final Office Action, dated Jan. 26, 2023.

U.S. Appl No. 17/446,031, Notice of Allowance, dated Sep. 7, 2023.

U.S. Appl. No. 17/446,031, Advisory Action, dated May 17, 2023.

U.S. Appl. No. 17/446,031, Request for Continued Examination, dated May 17, 2023.

* cited by examiner

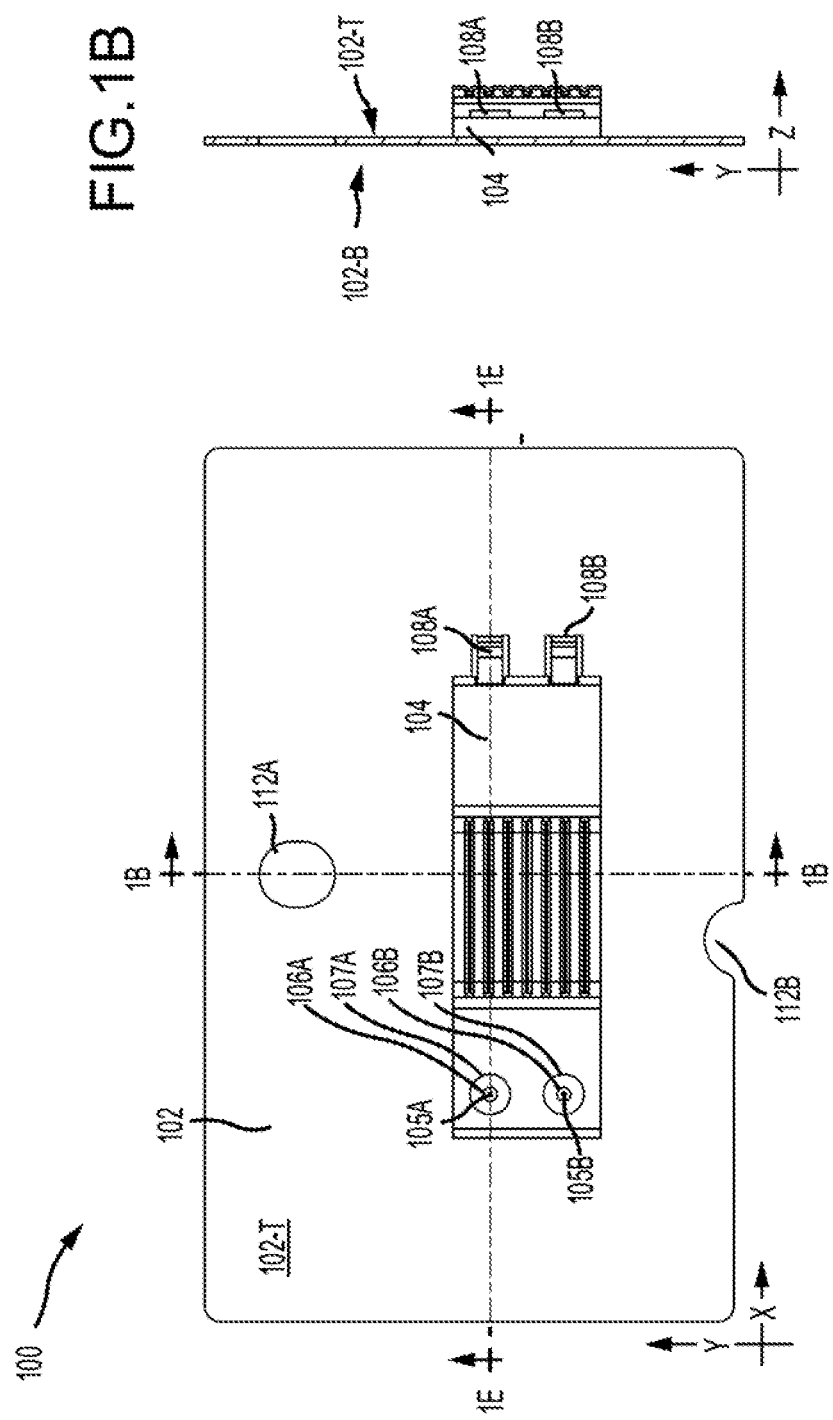

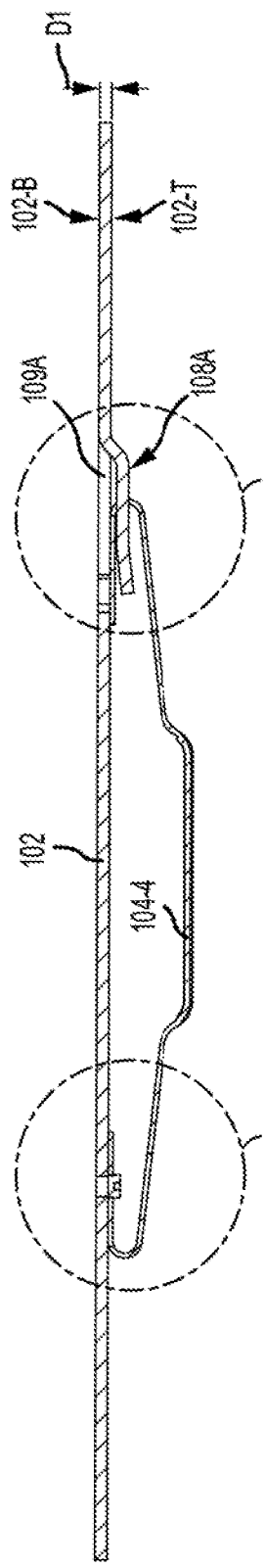
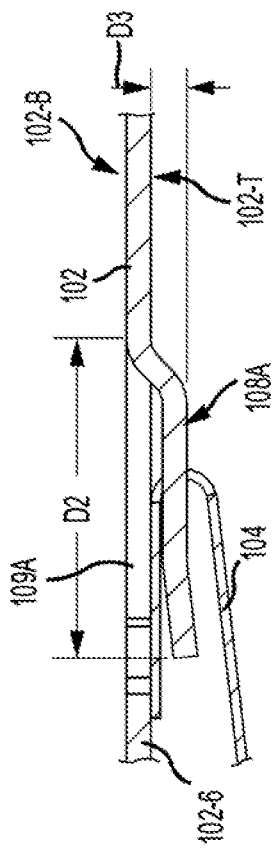
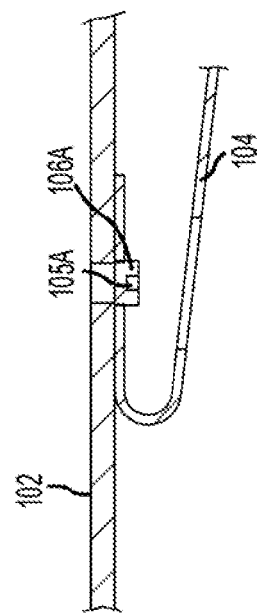

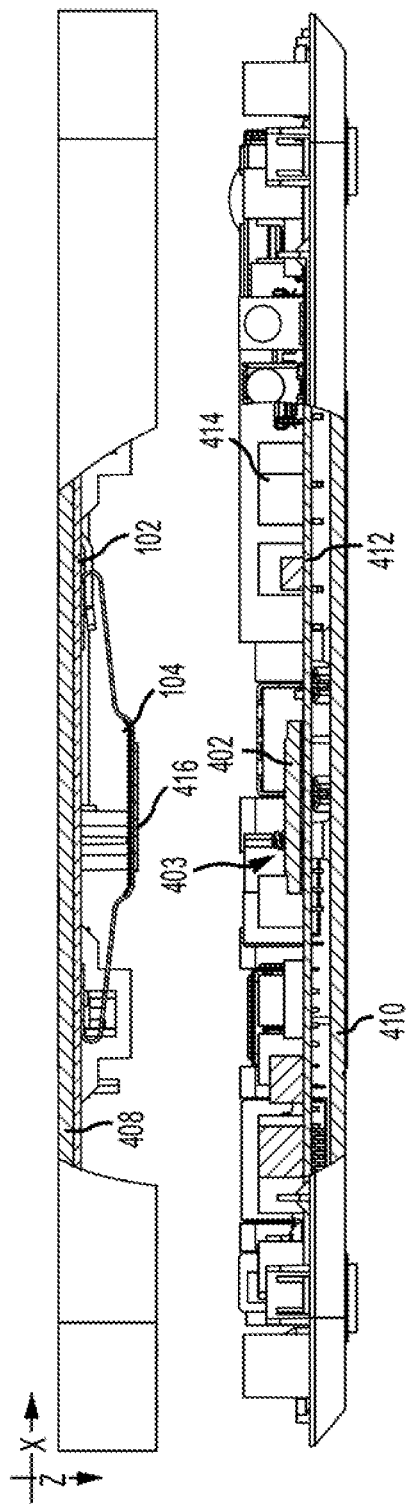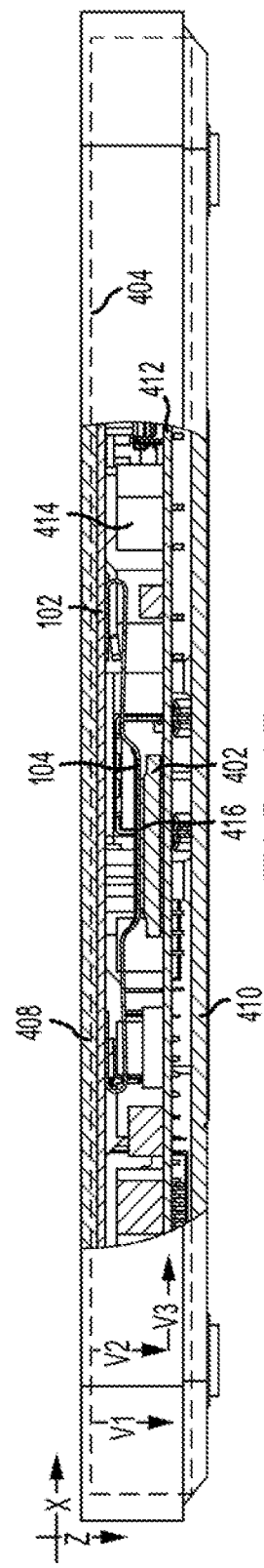

HEAT SPREADER DEVICE

CROSS-REFERENCE TO RELATED APPLICTIONS

The present application is a divisional application of and claims priority to U.S. application Ser. No. 15/729,866, filed on Oct. 11, 2017, in the name of inventor Lana Trygubova, and entitled "Heat Spreader Assembly," the entire contents of which are incorporated herein by reference.

TECHNICAL FIELD

The technology described herein generally relates to devices, systems, and methods for transferring heat from a component in an electronic device. More particularly, the various embodiments disclosed herein generally relate to heat spreader assemblies configured to transfer heat from microprocessors, memory devices, and other components in electronic devices to an external environment. More specifically, the various embodiments disclosed generally relate to a heat spreader configured to adjust to variances in enclosure designs and device heights to provide sufficient physical and/or thermal contact between a heat transfer component and a heat generating component when an enclosure for the device is in an assembled configuration.

BACKGROUND

Devices, including electronic devices such as set-top box assemblies, computers, smart phones, vehicle control systems, and others, commonly include one or more components that generate a heat. Such heat often needs to be transferred away from such component (hereafter, a "component" or a "heat generating component") to facilitate desire operating conditions for the component. Such heat transfer may often occur by use of thermal conduction between the component and a heat plate or similar assembly, where the heat plate is configured to further transfer the heat received from the component into an internal or external environment or to other components. Commonly, the heat plate uses thermal transfer mechanisms such as conduction, convection, radiation, evaporative cooling, active cooling, and other approaches known in the art for transferring heat.

More specifically, one approach for heat transfer in devices is to use a heat plate assembly to conduct heat away from one or more components in the device and across a wider area to enhance convective heat dissipation. Such a heat plate assembly often extends across a substantial portion of one or more of a device's surface enclosures, such as across a top enclosure, a side enclosure, or a bottom enclosure. The one or more heat plate assemblies are often configured to contact one or more heat generating components in the device, while often not contacting other non-heat generating components. That is, the heat plate assembly is often configured to transfer heat away from the one or more heat generating components and not transfer such heat to other components. Often the heat plate assembly needs to establish a firm contact with a heat generating component to transfer heat efficiently and effectively. Yet, such heat plate assemblies are often configured into and/or onto an enclosure of the device, which when in an open configuration does not contact the heat generating component and, when the device is in a closed or assembled configuration, does not directly contact the heat generating component without the use of intervening members.

Further, wide variances often exist between physical devices and design tolerances. That is, component heights, gaps between enclosure surfaces often materialize during manufacturing that present challenges in establishing the desired contact between a heat plate assembly and a given heat generating components. To bridge such gaps while considering the above mentioned and other deviations between design and actual devices, a spring or similar assembly is often used. Examples of uses of such spring members can be found, for example in U.S. Patent Publication 20170196121, entitled "Self-Adjustable Heat Spreader System for Set-Top Box Assemblies", which published on Jul. 6, 2017, in the name of inventors Trygubova et al., the entire contents of which are incorporated herein by references.

Accordingly, various approaches are known wherein one or more flexible members, or spring-like materials, may be used to bridge gaps and provide a bridge between a component and a heat plate or similar assembly. Such flexible members commonly are referred at heat spreaders and are configured to extend outwards from a heat plate assembly to fill an often-variable gap between a surface of the enclosure and a heat generating component and, when the device is in an assembled configuration, without extending undue force or pressure onto the contacted surface of the heat generating component. Yet, presently available heat spreaders suffer from numerous deficiencies.

First, heat spreaders commonly include springs or similar assemblies that are fixed to a heat plate. Such fixed springs do not permit movement of the spring relative to the heat plate other than by bending or warping of the spring member. When so deflected during closing of the device enclosure, a warped or uneven contact area between the spring of the heat spreader and the contacted surface of the heat generating member often occurs. Such uneven contact often decreases the effectiveness and efficiency of heat transfer.

Second, to prevent such uneven and/or warped springs from occurring, current designs commonly use a center block area that has an enlarged center block area. The enlarged center block is configured so as to prevent warping or bending of the spring at and near the desired contact area of the spring with the component. Yet, the use of enlarged center block areas often results in design configurations that are wasteful of material, undesired and/or non-controlled bending or warping of the spring elsewhere, and prevent convective cooling of the component at and/or about the contact area between the heat generating component and the heat spreader itself.

Accordingly, a need exists for heat spreaders having springs or similar assemblies that address the above and other concerns. These and other needs are addressed by the present disclosure.

SUMMARY

The various embodiments of the present disclosure relate in general to heat spreaders configured for use with heat plate assemblies to conduct heat away from heat generating components in electronic devices. The various embodiments also relate to heat plate assemblies that include one or more of the heat spreaders of the present disclosure. The various embodiments also relate to electronic devices that include and use one or more of the heat spreaders of the present disclosure to conduct heat away from a heat generating component in the electronic device, when such device is in use and at any time arising before or after use.

In accordance with at least one embodiment of the present disclosure a heat spreader, for use in a device, includes a spring, coupled to a heat plate. For at least one embodiment, the spring may include a first spring member configured to attach to the spring to the heat plate at a first location and a second spring member, connected to the first spring member. The second spring member may be configured to attach the spring to the heat plate along a second location when the device is in an unassembled state and at a third location when the device is in an assembled state. For at least one embodiment, the heat plate may include a first fastener configured to attach the spring to the heat plate at the first location and a second fastener configured to attach the second spring member to the heat plate at and between each of the second location and a third location. For at least one embodiment, a heat spreader may include a second fastener configured as a tab extending above a top surface of the heat plate and between the second location and a third location.

For at least one embodiment, a heat spreader may include a second spring member having a tab slot configured to accept a tab at each of a second location and a third location.

For at least one embodiment, a heat spreader may include a tab slot positioned at a second location when the device is in an unassembled state.

For at least one embodiment, a heat spreader may include a tab slot positioned at a third location when the device is in the assembled state.

For at least one embodiment, a heat spreader may include a first fastener configured as a rivet.

For at least one embodiment, a heat spreader may include a top spring member connected to each of a first spring member and a second spring member and configured to contact a top surface of a component in the device when the device is in an assembled state.

For at least one embodiment, a heat spreader may include a spring having a first connecting member connecting a first spring member to a top spring member and a second connecting member connecting the top spring member to a second spring member.

For at least one embodiment, a heat spreader may include a first connecting member having a first spring curvature and a second spring curvature. For at least one embodiment, the second connecting member includes a third spring curvature and a fourth spring curvature.

For at least one embodiment, a heat spreader when in an assembled state includes a spring that is vertically deflected about each of a first spring curvature and a third spring curvature.

For at least one embodiment, a heat spreader when in an assembled state includes a spring that is horizontally extended about each of a second spring curvature and a fourth spring curvature.

For at least one embodiment, a heat spreader includes a top spring member having at least two ribs.

For at least one embodiment, a heat spreader includes a thermal pad attached. For at least one embodiment, the thermal pad is attached to a top spring member and configured to facilitate heat transfer from a component of a device when the device is in the assembled state.

In accordance with at least one embodiment of the present disclosure, a heat spreader, for use in a device, includes: a heat plate; and a spring connected to the heat plate. For at least one embodiment, the heat plate includes: a first fastener configured to attach a spring to the heat plate at a first location; and a second fastener, configured to attach the spring to the heat plate at and between each of a second location and a third location.

For at least one embodiment, the second fastener may be a tab extending above a top surface of the heat plate and between the second location and the third location. For at least one embodiment, the spring may include a first spring member configured to attach the spring to the heat plate at the first location and a second spring member.

For at least one embodiment, the second spring member may include a tab slot configured to accept the tab at each of the second location and the third location and attach the spring to the heat plate at the second location when the device is in an unassembled state and at the third location when the device is in an assembled state.

For at least one embodiment, a top spring member may include: at least two ribs configured to contact a top surface of a component in the device when the device is in the assembled state; a first connecting member, connecting the first spring member to the top spring member, having at least a first spring curvature and a second spring curvature; and, a second connecting member, connecting the top spring member to the second spring member, having at least a third spring curvature and a fourth spring curvature. For at least one embodiment and when the device is in the assembled state, the spring may be vertically deflected by a deflection of at least one the first spring curvature and the third spring curvature. For at least one embodiment and when the device is in the assembled state, the spring may be horizontally extended by an extension of at least one of the second spring curvature and the fourth spring curvature.

For at least one embodiment a heat spreader may include a thermal pad attached to the a spring member and configured to facilitate heat transfer from a component when the device is in the assembled state. For at least one embodiment a heat spreader may include use of a fastener. For at least one embodiment, the fastener is a rivet.

For at least one embodiment a heat spreader may include a rivet opening. For at least one embodiment a heat spreader may include a rivet tool opening.

In accordance with at least one embodiment of the present disclosure, a method of assembling a device may include the operation of positioning a heat spreader in a first enclosure of a device while the device is in an unassembled state.

In accordance with at least one embodiment of the present disclosure, a method of assembling a device may include the operation of attaching a spring to a heat plate. For at least one embodiment, the spring may include a top spring member.

For at least one embodiment, a method of assembling a device may include the operation of, prior to the positioning of a heat spreader in a first enclosure, attached a spring to the heat plate at a first location and at a second location. For at least one embodiment, attachment of the spring to the heat plate at the first location and at the second location results in an alignment of a top spring member with a top surface of a component in the device while the device is each of the unassembled and in an assembled state.

For at least one embodiment, a method of assembling a device may include the operation of lowering a first enclosure towards a second enclosure of a device.

For at least one embodiment, the method may include use of a spring configured to vertically deflect and horizontally extend as contact is made between a top spring member and a top surface of a component while the device is assembled.

For at least one embodiment, the operation of lowering of a first enclosure towards a second enclosure of a device results in a vertical deflection of a spring. For at least one embodiment, the operation of lowering a first enclosure towards the second enclosure results in a horizontal extension of a spring.

For at least one embodiment, upon the vertical deflection and horizontal extension of a spring, a top spring member is thermally connected to a top surface of a component. For at least one embodiment, a method of assembling a device may include the operation of securing the first enclosure to the second enclosure.

For at least one embodiment, a method of assembling a device may include the use of a spring having a first connecting member and a second connecting member. For at least one embodiment, a method of assembling a device may result in a vertical deflection of a spring. For at least one embodiment, the vertical deflection may occur along at least one of a first connecting member and a second connecting member.

For at least one embodiment, a method of assembling a device may result in a horizontal extension of the spring. For at least one embodiment, the horizontal extension may occur along at least one of a first connecting member and a second connecting member. For at least one embodiment, a method of assembling a device may include the operation of attaching a thermal pad to a top spring member. For at least one embodiment, the thermal pad may be configured to transfer heat from a component to the spring when a device is in an assembled state.

BRIEF DESCRIPTION OF THE DRAWINGS

The features, aspects, advantages, functions, modules, and components of the devices, systems and methods provided by the various embodiments of the present disclosure are further disclosed herein regarding at least one of the following descriptions and accompanying drawing figures. In the appended figures, similar components or elements of the same type may have the same reference number, such as 108, with an additional alphabetic designator, such as 108*a*, 108*n*, etc., wherein the alphabetic designator indicates that the components bearing the same reference number, e.g., 108, share common properties and/or characteristics. Further, various views of a component may be distinguished by a first reference label followed by a dash and a second reference label, wherein the second reference label is used for purposes of this description to designate a view of the component. When only the first reference label is used in the specification, the description is applicable to any of the similar components and/or views having the same first reference number irrespective of any additional alphabetic designators or second reference labels, if any.

FIG. 1A is a top view of an assembled heat spreader in accordance with at least one embodiment of the present disclosure.

FIG. 1B is a cross-section view of the heat spreader of FIG. 1A taken along line 1B-1B of FIG. 1A and in accordance with at least one embodiment of the present disclosure.

FIG. 1E is a cross-sectional view of the heat spreader of FIG. 1A taken along line 1E-1E of FIG. 1A and in accordance with at least one embodiment of the present disclosure.

FIG. 1F is an enlarged view of the area indicated by circle 1F in FIG. 1E for the heat spreader of FIG. 1A and in accordance with at least one embodiment of the present disclosure.

FIG. 1G is an enlarged view of the area indicated by circle 1G in FIG. 1E for the heat spreader of FIG. 1A and in accordance with at least one embodiment of the present disclosure.

FIG. 4A is a partial cross-sectional view of a device, having a heat spreader configured in accordance with at last one embodiment of the present disclosure, where the device is in an unassembled state.

FIG. 4B is a partial cross-sectional view of a device, having a heat spreader configured in accordance with at last one embodiment of the present disclosure, where the device is in an assembled state.

DETAILED DESCRIPTION

Figure 1D:
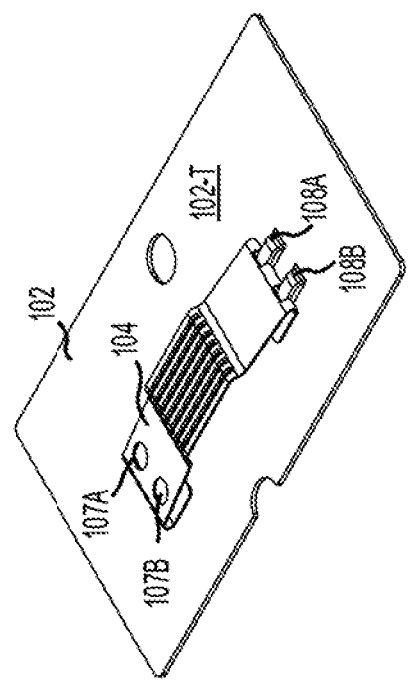
FIG. 1D is a top perspective view of the heat spreader of FIG. 1A in accordance with at least one embodiment of the present disclosure.

The various embodiments described herein are directed to devices, systems, and methods for using a heat spreader that is configured to transfer heat away from a heat generating component in an electronic device or other device using a heat plate or similar assembly and at least one spring. Such heat spreaders of the present disclosure may be configured to fill a gap that may otherwise arise between a heat plate situated on or about an enclosure of a device and a heat generating component in such device. The device may be any type of device that generates heat and where such heat may be transferred to the device elsewhere using an embodiment of the heat spreader of the present disclosure. Non-limiting examples of such devices include computers, set-top boxes, televisions, smart-phones, automobile electronics, and others. The one or more embodiments of such a heat spreader may be configured to improve the efficiency of the device by improving the thermal control properties of such device. It is to be appreciated, that improvements in thermal control, for a device, may result in improvements in power, energy use, operating characteristics, and otherwise.

As shown in FIGS. 1A to 1G and in accordance with at least one embodiment of the present disclosure, a heat spreader 100 for use in a device 400, as shown in FIG. 4A, to transfer heat away from a component in such device and into an environment includes a heat plate 102, as further shown in FIGS. 2A-2E, that is mechanically and thermally coupled to a spring 104, as further shown in FIGS. 3A-3E. It is to be appreciated that heat may be transferred to/from the component via the spring 104 and heat plate 102 into an environment 404 internal to the device 400 and/or to an environment external to the device 400, as desired for any given implementation of an embodiment of the present disclosure. Such heat transfer may occur by use of well-known thermodynamic principles including thermal conduction, convection, radiation, combinations thereof, and otherwise. A person having ordinary skill in the art will appreciate that active and/or passive thermal control technologies may be used in conjunction with the heat plate.

Figure 1C:
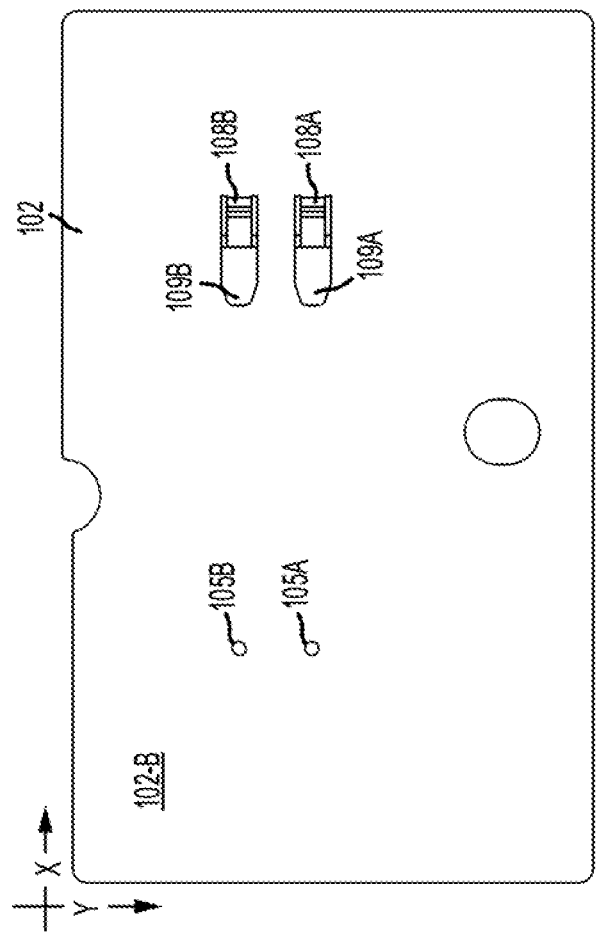
FIG. 1C is a bottom view of the heat spreader of FIG. 1A in accordance with at least one embodiment of the present disclosure.

The heat plate 102 has a top surface 102-T, as shown in FIG. 1A, and a bottom surface 102-B, as shown in FIG. 1C. For at least one embodiment, the heat plate 102 may include a substantially flat surface. For other embodiments, the heat plate 102 may have any suitable form.

The heat plate 102 may be sized to accommodate the heat transfer properties desired for a given device 400, as shown in FIGS. 4A and 4B, and/or one or more heat generating components 402 thereof. The heat plate 102 may be configured to abut an enclosure, such as a top enclosure 408, or other member of a device 400, and to receive heat conducted from a component 402 in the device 400, using at least the spring 104. The heat plate 102 may be configured to transfer the heat transferred to hit, via the spring 104, from the component 402 to an internal or external environment and/or to other components in a device 400, such as component 414. It is to be appreciated that such components 402 and 414 may mechanically, thermally, and/or electrically interconnected by use of printed circuit boards (PCBs) 412, wiring, or other known structures. Accordingly, the transfer of heat by use of an embodiment of a heat spreader 100 of the present disclosure is not intended for use only with the transfer of heat arising from any single, given component, such as component 402. As desired for any given implementation of an embodiment of the present disclosure, heat spreader 100 may be used for any transfer of heat to/from/ within or without a device, by using principles of conduction and convection, radiation or otherwise. Further, such heat transfer may occur throughout and/or out of the device, as desired for any given embodiment. It is to be appreciated that the heat plate 102 may also be configured to transfer heat from one or more heat generating components in a device to one or more heat absorbing components in a device. The use of a heat plate 102 is accordingly not to be construed as being limited for only the transfer heat from a component 402 and out of a device, but is also to be considered as being applicable to any desired transfer of heat through, in and/or out of a device.

In at least one embodiment, the heat plate 102 is constructed of plate aluminum and has a first thickness D1. For at least one embodiment, D1 equals 1.0 mm. In other embodiments, other materials and/or thicknesses thereof may be utilized to facilitate heat transfer in a device. Such materials and their respective heat transfer properties are well known in the art and are not described further herein.

Figure 2B:
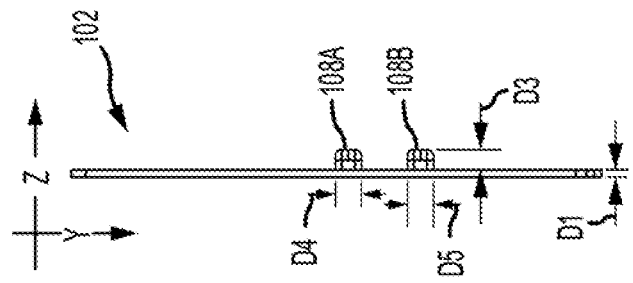
FIG. 2B is a left side view of the heat plate member of FIG. 2A and in accordance with at least one embodiment of the present disclosure.
Figure 2A:
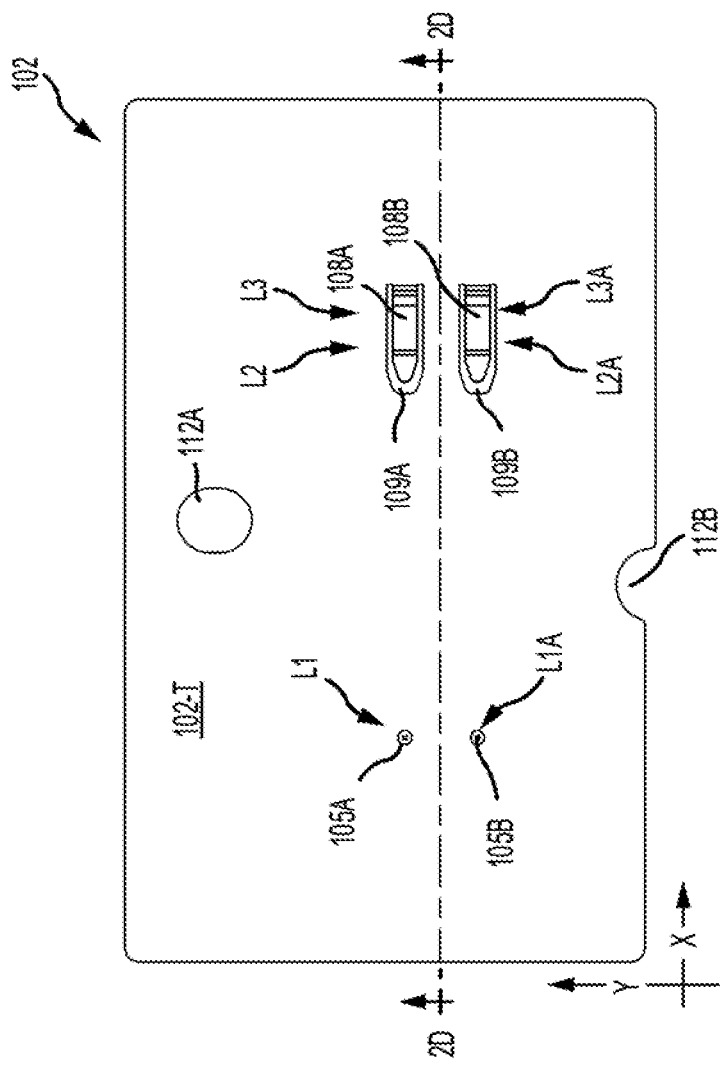
FIG. 2A is a top view of a heat plate member of a heat spreader and in accordance with at least one embodiment of the present disclosure.
Figure 2C:
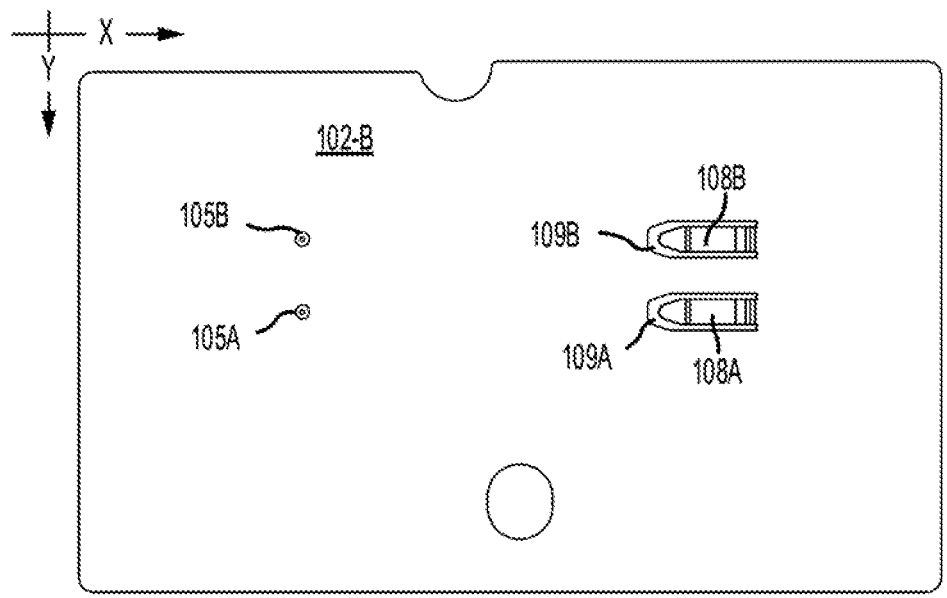
FIG. 2C is a bottom view of the heat plate member of FIG. 2A and in accordance with at least one embodiment of the present disclosure.

The heat plate 102 may be configured to include one or more rivets 105A/105B at respective one or more first locations, such as locations L1A and L1 shown in FIG. 2A. It is to be appreciated that the one or more first locations may be located anywhere on the heat plate 102, as desired for an implementation of any given embodiment of the present disclosure. The rivets 105A/105B may be aligned in one or more directions. For at least one embodiment, the rivets 105 may be used to mechanically connect the spring 104 to the heat plate 102. For at least one embodiment, the rivets 105 may be configured to thermally couple the spring 104 to the heat plate 102. The sizing of the rivets 105 may vary based upon the size of the spring 104, the anticipated amount of vertical, horizontal, and/or shear forces imparted on the spring 104 when in one or more of various states, as described below, and in view of other factors known in the art, such as the heat conductive properties of materials and otherwise.

Figure 2D:
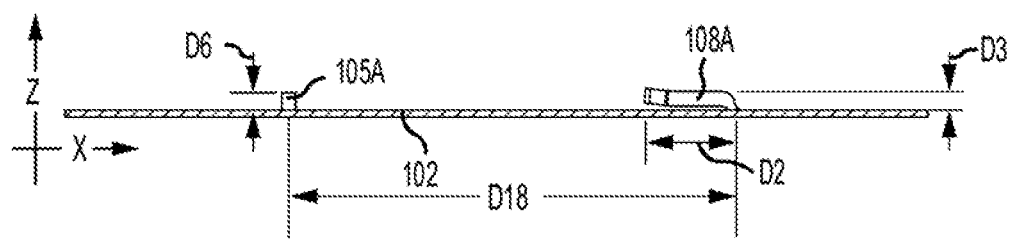
FIG. 2D is a cross-section view of the heat plate member FIG. 2A and in accordance with at least one embodiment of the present disclosure.
Figure 2E:
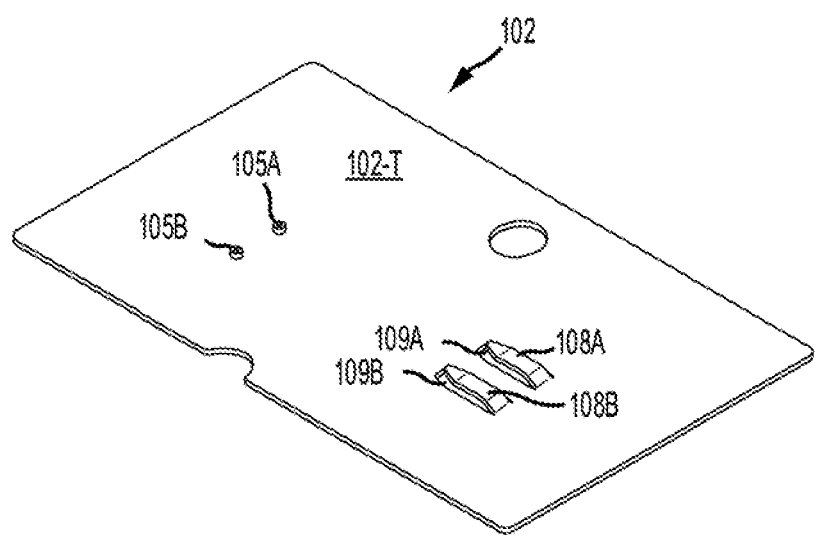
FIG. 2E is a top perspective view of the heat plate member of FIG. 2A and in accordance with at least one embodiment of the present disclosure.

For at least one embodiment, the rivets 105 may be formed by use of riveting, punch metal, or other known metal processing techniques. The rivets may be positioned at any desired first location(s) on the heat plate 102, as intended for use in securing at least one spring 104 of corresponding size and dimension to the heat plate 102. As shown in FIG. 2D, a rivet 105A may have a height D6. For at least one embodiment, the height of a first rivet 105A is the same as the height of a second rivet 105B. For at least one embodiment, a first rivet 105A has a different height than the second rivet 105B. Each rivet 105A/105B has a desired radius. For at least one embodiment, the radius of the first rivet 105A is the same as the radius of the second rivet 105B. For at least one embodiment, the first rivet 105A has a different radius than the second rivet 105B. A person of ordinary skill in the art will appreciate that height and radius of a rivet used for any given embodiment is commonly dependent upon the thickness and intended use of the materials being riveted. Accordingly, D6 is not limited to any height or radius. Accordingly, it is to be appreciated that the rivets may have a uniform properties, such as height and radius, or varying properties and known acceptable tolerances between rivet properties are well-known by a person having ordinary skill in the art.

The heat plate 102 may also be configured to include one or more tabs 108A/108B extending along one or more second locations, as shown by designators L2 and L2A in FIG. 2A, and one or more third locations, as shown by designators L3 and L3A in FIG. 2A, relative to a plane formed by the heat plate 102. It is to be appreciated that the one or more second locations and third locations are not fixed locations and generally refer to locations relative to the heat plate 102 with respect to which a given tab extends above and/or about and as desired for an implementation of any given embodiment of the present disclosure. The tabs 108A/108B may be aligned in one or more directions. For at least one embodiment, the tabs 108 may be used to slidably engage and mechanically connect the spring 104 to the heat plate 102 at each of the second and third locations. For at least one embodiment, the tabs 108 may be used to thermally couple the spring 104 to the heat plate 102. As shown in FIG. 1G and for at least one embodiment, a tab 108 may be formed by suitably stamping, punching, and/or bending a portion of the heat plate 102 such that a tab member 108 extends from the surface of the heat plate 102. For at least one embodiment, a tab member 108 extends a distance D3 such that a tab opening 109 is formed in the surface of the heat plate 102. A tab 108 may have a length D2. For at least one embodiment, D2 equals approximately 10 mm. For at least one embodiment, the length of a first tab 108A is the same as the length of a second tab 108B. For at least one embodiment, a first tab 108A has a different length than the second tab 108B. Further, each tab 108A and 108B may be positioned on the heat plate 102 a distance from one or more corresponding rivets 105 to facilitate the retention of the spring 104 on the heat plate 102 while also permitting lateral movement of the spring 104 relative to the heat plate 102 when transitioning from the unassembled state to the assembled state. For at least one embodiment and as shown in FIG. 2D, a tab 108A is a distance D18 from a corresponding rivet 105A, where D18 is measured from the center of the rivet 105A to the outer edge of the tab 108A. For at least one embodiment, D18 is approximately 62 mm.

As shown in FIGS. 1G and 2D, for at least one embodiment, the first tab 108A extends a distance D3 above the top surface 102-T of the heat plate 102. For at least one embodiment, D3 is approximately 1.50 mm. For at least one embodiment, each of the first tab 108A and the second tab 108B extend the same distance D3 above the top surface 102-T of the heat plate 102. For at least one embodiment, the first tab 108A and the second tab 108B each extend a different distance above the top surface 102-T of the heat plate 102.

As shown in FIG. 2B for at least one embodiment, the first tab 108A has a width D4. For at least one embodiment, D4 is approximately 3.40 mm. For at least one embodiment, the width D4 of the first tab 108A is the same as the width D5 of the second tab 108B. For at least one embodiment, the width D4 of the first tab 108A is different than the width D5 of the second tab 108B.

It is to be appreciated, that for at least one embodiment, a tab 108 may be formed without using one or more metal stamping, punching, and bending processes and instead by attaching separately formed tab members to the heat plate 102. Such attachment may occur using fasteners, adhesives, metal bonding, any other known processes. When a tab is formed using separate materials, a tab opening 109A may not be present or formed in the heat plate 102. Likewise, it is to be appreciated that for at least one embodiment, rivets may not be utilized to attach the spring 104 to the heat plate 102. Instead and for at least one embodiment, a corresponding set of second tabs may be used in lieu of the rivets to attach each end of the spring 104 to the heat plate 102.

The spring 104 may be sized and configured to abut a surface area of one or more selected heat generating components 402 in a device 400, FIG. 4A. In at least one embodiment, the spring 104 may be sized to abut a top surface 403 of a component 402. The top surface 403 may have any desired geometric shape. For at least one embodiment, the top surface 403 is a substantially flat surface. In other embodiments, the spring 104 may be configured to abut and/or contact other surface areas of a component 402, such as a bottom, a side, an extension, combinations thereof, or otherwise.

As discussed above and as shown in FIGS. 3A-3F for at least one embodiment, the spring 104 may include a first spring member 302, a top spring member 306, and a second spring member 310. For at least one embodiment, the first spring member 302 is configured to be attached to the heat plate 102 by the one or more rivets 105. For at least one embodiment, the top spring member 306 is configured to make physical contact with the top surface 403 of the heat generating component 402. The second spring member 310 is configured to make physical contact with the one or more tabs 108. At least one of the first spring member 302 and the second spring member 310 are configured to facilitate thermal conductivity between the heat generating component 402 and the heat plate 102.

For at least one embodiment, the first spring member 302 is connected to the top spring member 306 by a first connecting member 304. For at least one embodiment, the first connecting member 304 includes a flat first connecting member 304S. For at least one embodiment the first flat connecting member 304S is substantially flat and is approximately 19 mm long. Other lengths may be used for other embodiments. For at least one embodiment, the first connecting member 304 also includes a first spring curvature 303 and a second spring curvature 305. For at least one embodiment, the second spring curvature 305 is 2.4 mm long. Other embodiments may utilize different lengths.

For at least one embodiment, at least one of the first spring curvature 303 and the second spring curvature 305 are configured to respectively bend in the vertical direction "Y" to facilitate the vertical deflection of the spring 104. For at least one embodiment, at least one of the first spring curvature 303 and the second spring curvature 305 are configured to extend in the horizontal direction "X" to facilitate the horizontal extension of the spring 104.

For at least one embodiment, the second spring member 310 is connected to the top spring member 306 by a second connecting member 308. For at least one embodiment, the second connecting member 308 includes a flat second connecting member 308S. For at least one embodiment the second flat connecting member 308S is substantially flat and has a length of approximately 19 mm for at least one embodiment. However, other lengths may be used for other embodiments.

For at least one embodiment, the second connecting member 308 includes a third spring curvature 307 and a fourth spring curvature 309. For at least one embodiment, at least one of the third spring curvature 307 and the fourth spring curvature 309 are configured to respectively bend, in the vertical Y direction, to facilitate the vertical deflection of the spring 104. For at least one embodiment, at least one of the third spring curvature 307 and the fourth spring curvature 309 are configured to respectively extend in the horizontal X direction, to facilitate the horizontal extension of the spring 104. For at least one embodiment, the second spring curvature 305 is longer than the third spring curvature 307.

For at least one embodiment, at least one of the first spring member 302, the top spring member 304, and the second spring member 310 are configured to not substantially bend vertically while the spring 104 is vertically deflected while in the transition and assembled states. Instead, any substantial bending and/or deflection of the spring 104 occurs in one or more of the first spring curvature 303, the first connecting member 304, the second spring curvature 305, the third spring curvature 307, the second connecting member 308, and/or the fourth spring curvature 309. It is to be appreciated that by varying the thickness of the material used at one or more of the above-mentioned members of the spring 104, the vertical deflection and/or horizontal extension of the spring 104 during the transition and assembled states may be controlled.

For at least one embodiment, the top spring member 306 has a length D13. For at least one embodiment, D13 equals approximately 20 mm.

For at least one embodiment, the top spring member 306 may include one or more ribs 312a-312n which extend above the surface of the top spring member 306. The ribs 312a-n may be formed using any known technique including but not limited to punching and stamping, metal deposition, affixing or otherwise. For at least one embodiment, the ribs 312a-n are formed by stamping the top spring member 306 such that multiple recesses 313a-n are formed in the top spring member 306. It is to be appreciated that when stamped into the top spring member 306, and depending on whether shown in a top, bottom or other view, the orientation of the ridges 312a-n and recesses 313a-n will vary. For at least one embodiment, a ridge extends a height D14 above the bottom of the recesses 313a-n. For at least one embodiment, D14 is approximately 0.70 mm. For at least one embodiment, D14 is a uniform height for each ridge and any adjacent recess(es) on the top spring member 306. For at least one embodiment, D14 may vary with respect to any given pairing of a ridge 312 and a recess 313. For at least one embodiment, seven ridges 312a-n are formed on the top spring member 306. It is to be appreciated that any number of ridges 312 and recesses 313 may be used for any given implementation of an embodiment of the present disclosure. For at least one embodiment, the ribs 312a-312n are oriented on the top spring member 306 substantially parallel to a length of the spring 104, where the length is in the "X" direction shown in FIG. 3B. Other orientations of the ribs 312a-312n may be used for other embodiments. For at least one embodiment, the ribs 312a-312n are oriented on the top spring member 306 to provide a substantially flat contact surface when positioned relative to a top surface 403 of the component 402 when the device 400 is in the assembled state. For at least one embodiment, the ribs 312a-312n are oriented on the top spring member 306 to prevent electrical contact between the spring 104 and the component 402 when the device is in the assembled state.

For at least one embodiment, the top spring member 306 may include a metal block (not shown). For at least one embodiment, the ribs 312a-n may be used in place of and/or in addition to a metal block. It is to be appreciated that a combination of a metal block and ribs may be used in accordance with at least one embodiment of the present disclosure. The layout of such metal block and/or ribs may vary based upon the shape and configuration of the top spring member 306 and the shape and configuration of a top surface 403 of the component 402.

For at least one embodiment, the spring 104 may include a tab slot 314. For at least one embodiment, a tab slot 314 is sized to correspond to the dimensions of a given tab 108 on a heat plate 102 such that desired amount of vertical and horizontal pressure arises between the given tab 108 and the given tab slot 314, such vertical and horizontal pressures being sufficient to provide a desired mechanical and thermal connection between the spring 104 and the heat plate 102. It is to be appreciated that the sizing of a given tab slot 314 relative to a given tab 108 may vary from embodiment to embodiment and will generally arise within a pre-determined range of tolerances. For at least one embodiment, the tab slot has a length D16 and a width D17. For at least one embodiment, D16 is approximately 4 mm and D17 is approximately 2.75 mm.

Figure 3A:
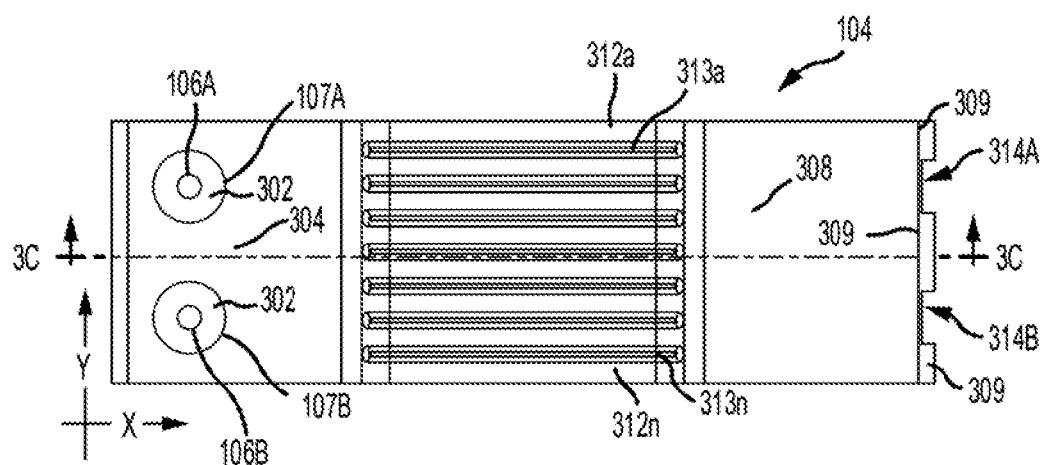
FIG. 3A is a top view of a spring member and in accordance with at least one embodiment of the present disclosure.
Figure 3B:
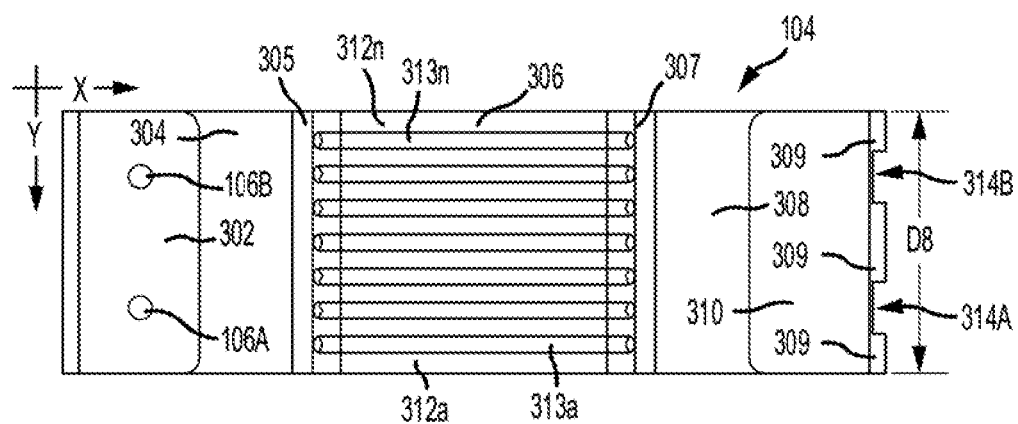
FIG. 3B is a bottom view of the spring member of FIG. 3A and in accordance with at least one embodiment of the present disclosure.
Figure 3C:
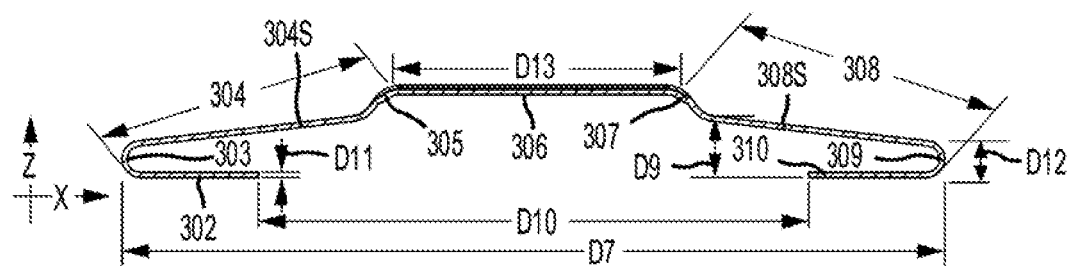
FIG. 3C is a cross-section view of the spring member of FIG. 3A and in accordance with at least one embodiment of the present disclosure.
Figure 3D:
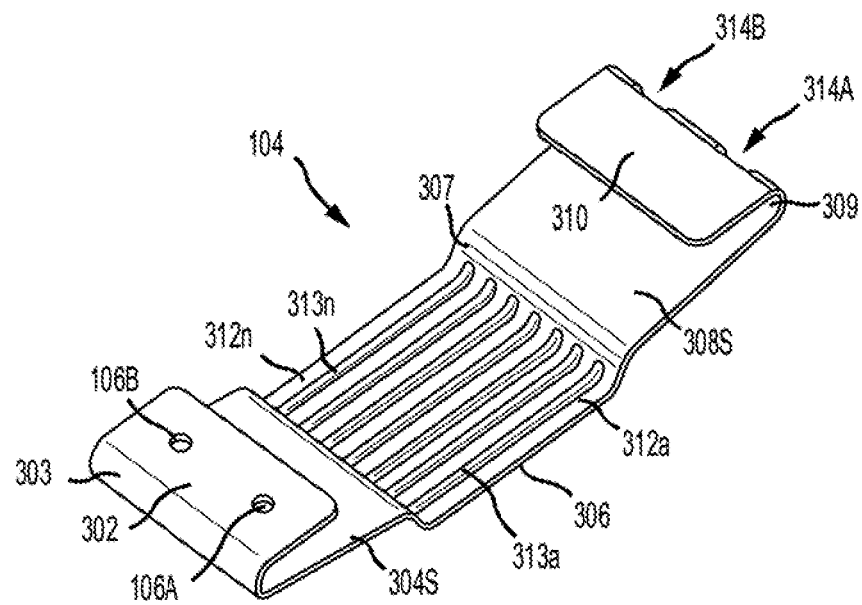
FIG. 3D is a bottom perspective view of a spring member of FIG. 3A and in accordance with at least one embodiment of the present disclosure.
Figure 3E:
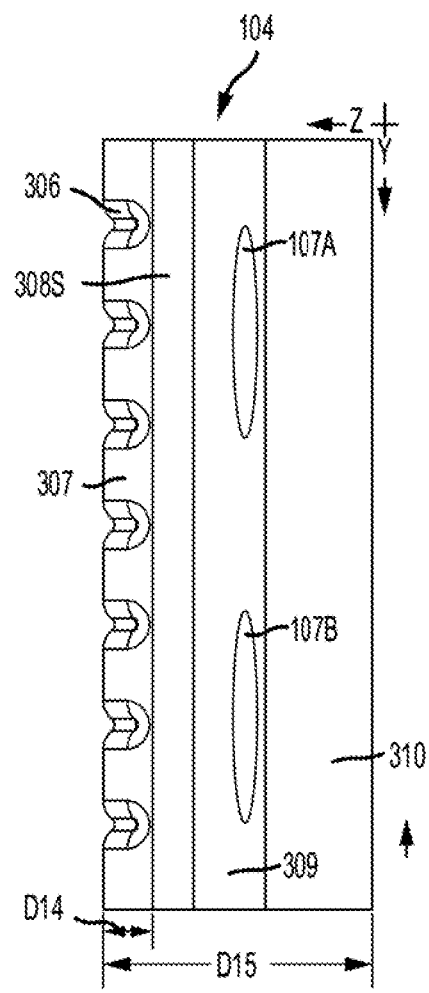
FIG. 3E is a left-side view of the spring member FIG. 3A in accordance with at least one embodiment of the present disclosure.
Figure 3F:
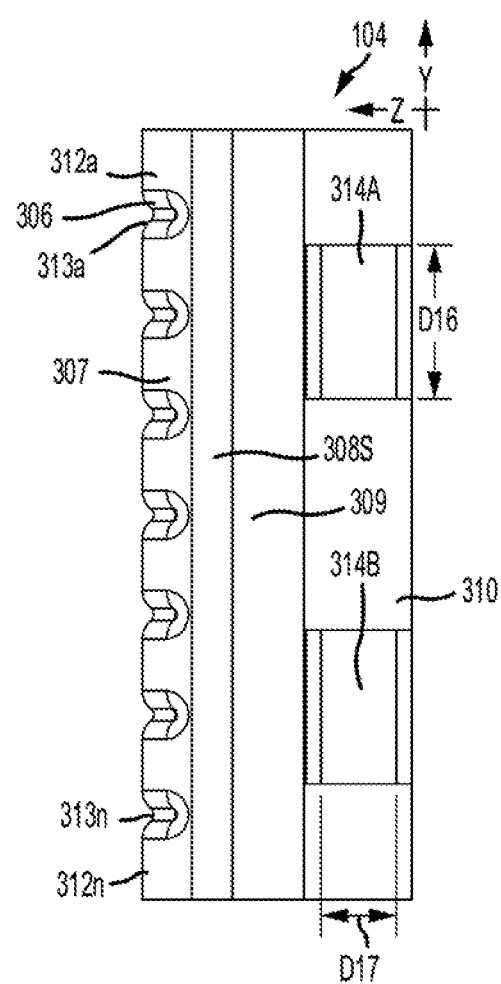
FIG. 3F is a right-side view of the spring member of FIG. 3A and in accordance with at least one embodiment of the present disclosure.

As discussed above, the spring 104 may be mechanically attached to heat plate 102 by one or more rivets 105, such as rivets 105A and 105B. As discussed above and further shown in FIGS. 2D and 2C, the rivets 105A and 105B may be punched into the heat plate 102 prior to attachment of the spring 104 to the heat plate 102. As shown in FIGS. 1A and 3A, the rivets 105 may be configured to extend into a rivet opening 106A/106B in the first spring member 302. The one or more rivet openings 106 may be sized and configured using known and conventional riveting principles and techniques. The spring 104 may be attached to the heat plate 102 by aligning the rivet openings 106 with the rivets 105 and pressing the first spring member 302 onto the heat plate 102. To facilitate such riveting, rivet tool openings 107A/107B may be provided in the first spring connecting member 304. For at least one embodiment, the rivet tool openings 107 are optional and a suitable press tool or other techniques may be used to press the one or more rivet openings 106 onto the rivets 105 and thereby attach the first spring member 302 to the heat plate 102. It is also to be appreciated that for other embodiments, the spring 104 may be attached to the heat plate 102 using other known types of connections, such as mechanical, adhesive, metal bonds, combinations thereof, or otherwise. Further, it is to be appreciated that any number of rivets or other connectors may be utilized to attach the first spring member 302 to the heat plate 102. For at least one embodiment, the first spring member 302 may be attached to the heat plate using one or more tabs 108 on the heat plate 102 and one or more tab slots 314 in the spring 104.

For at least one embodiment, the spring 104 is constructed from copper metal and has a thickness of approximately 0.4 mm. For at least one embodiment, the spring 104, when in the non-assembled state, has a length D7 of approximately 63 mm, a width D8 of approximately 20 mm, a height D9 of approximately 5 mm, a gap D10 of approximately 42 mm between the end of the first spring member 302 and the end of the second spring member 310, a thickness D11 of approximately 0.5 mm, a height D12 of approximately 3 mm, and a height D15 of approximately 8.0 mm. It is to be appreciated that other materials, lengths, widths and/or thicknesses thereof may be used for any given implementation of an embodiment of the present disclosure. For at least one embodiment, the spring 104 may be configured to vertically deflect, between 1 and 4 mm as measured at either of the first spring curvature 303 or the fourth spring curvature 309, in relation to the spring 104 in an unassembled state versus an assembled state. It is to be appreciated that other extensions and/or vertical deflections of the spring 104 may arise when the spring 104 is used for any given implementation of an embodiment of the present disclosure.

As shown in FIGS. 4A and 4B, the spring 104 may be configured to conform to at least two corresponding shapes arising under at least two states: an unassembled state, as shown in FIG. 4A, and an assembled state, as shown in FIG. 4B. For the unassembled state, the spring 104 may be configured to have an expanded configuration, such that the spring 104 is not under pressure and is not extended longitudinally or deflected vertically relative to a first plane formed by the heat plate 102.

As shown in FIG. 4B, when in the assembled state, the spring 104 is configured into a second form, where the spring 104 is compressed vertically and extended laterally. While the spring 104 transitions from the unassembled state to the assembled state, a transition state occurs. During the transition state, pressure applied to the top enclosure 408 is transferred to the spring 104 while the spring 104 begins to contact, and while remaining in contact with, the heat generating component 402. Such pressure is absorbed, at least in part, by lateral extension, as represented by V3, and vertical deflection, as represented by V2, of the spring 104. It is to be appreciated that the amount of extension and deflection of the spring 104 may be pre-determined by a person having ordinary skill in the art in view of the properties chosen for a given spring 104 and that such properties may be selected such that any extension and deflection of the spring 104 when in the assembled state provides the desired amount of pressure by the spring 104 on the heat generating component 402. For at least one embodiment, the spring 104 may be configured to fill, substantially, completely, or partially, one or more gaps that would otherwise exist, absent use of the spring 104, between the heat plate 102 and the heat generating component 402 when the device 400 is in the assembled state.

For at least one embodiment, the use of the tabs 108 on the heat plate 102 and tab openings 109 on the spring 104 to attach at least one end of the spring 104 to the heat plate 104 may facilitate translation of a vertical force V1 on the spring 104 into a lateral force V3 and a second vertical force V2, where V2 is less than V1. That is, the second spring member 310 (as shown in FIGS. 3A-3F) will further extend under and towards the tabs 108 such that the tab slots 314 shift from the second location to the third location when in the device 400 transitions from the unassembled state to the assembled state. The spring 104 will maintain this extended form during the assembled state. It is to be appreciated that the extension of the spring 104 results in absorption of some of the vertical force V1 applied to the spring 104 during the transition and assembled states. Such extension of the spring 104 enables the spring 104 to fill any gap without inducing a crimping or bending of the spring 104 at or about the area of contact of the spring 104 with the desired contact surface on the component 402.

More specifically and for at least one embodiment, during the transition state and while the top enclosure 408 is being affixed and remains affixed, during the assembled state, to the bottom enclosure 410, a force V1 is applied, via the spring 104 onto the component 402. For at least one embodiment, the spring 104 design of the present disclosure enables the heat spreader 100 to translate the force V1 into at least two force components: a lateral force V3 and a second vertical force V2. It is to be appreciated that V1 is a function of V2 and V3, and the values of V2 and V3 will vary based on the properties of the spring 104 chosen for any given embodiment. Likewise, the value of V1 will vary based on the amount of force applied by the spring 104 on the component 402 during assembly of the device 400 and while the device is assembled. It is to be appreciated that such force V1 may vary based on the size of the actual gap 416 to be covered by the spring 104 versus the actual gap encountered for any given implementation, the thickness of the spring 104 and other known factors.

Further, for at least one embodiment, the relative direction of the lateral force V3 may be defined by a plane formed by the area of the spring 104 in contact with the component 402 during the transition and assembled states. It is to be appreciated, that such lateral force need not arise in relation to a fixed geometric coordinate system, such as a system defined by a plane formed by a portion of the top enclosure 408 or the bottom enclosure 410 of the device 400, and may arise at any relative orientation thereto.

For at least one embodiment, the heat spreader 100 may include use of a thermal pad 416 that can be affixed to the top spring member 306. In accordance with at least one embodiment, the thermal pad 416 includes a silicone elastomer with thermal conductivity properties of approximately 7.0 W/mK over a temperature range of approximately 40 to 160 degrees Celsius. For at least one embodiment, the thermal pad 416 has a thickness of approximately 0.5 mm with a thickness tolerance of 20%. For at least one embodiment, the thermal pad 416 may be sized to the dimensions of the top spring member 306. Other embodiments may use thermal pads having different characteristics and size, as desired for any given implementation of an embodiment of the present disclosure. The use, configuration and properties of thermal pads are well-known in the art and the present disclosure is not limited to any given type of configuration of thermal pad.

For at least one embodiment, a method of assembling the heat spreader 100 may include first stamping and configuring the heat plate 102 to include the one or more rivets 105 and the one or more tabs 108. The operations may include configuring the spring 104 to have the desired members, including the first spring member, second spring member, top spring members and the connecting and curvature members. The operations may include fabricating the members to have a desired thickness. The operations may include, when riveting is utilized to mechanically connect the spring 104 to the heat plate 102, forming a rivet opening 106 and a rivet tool opening 107. The operations may include fabricating the spring 104 to include at least one tab slot 314. The operations may include fabricating the top spring member to include one or more ribs 312. The operations may include positioning the spring 104 on the heat plate 102 by inserting each tab 108 into a corresponding tab slot 314 such that the tab slot 314 corresponds to the tab 108 at the second location. The operations may include attaching the first spring member 302 to the heat plate 102. For at least one embodiment, such attachment may occur by positioning a rivet opening 106 on a spring 104 above a corresponding rivet 105 on a heat plate 102 and using compressive forces to rivet the spring 104 to the heat plate 102. For at least one embodiment, attachment of a first spring member 302 to a heat plate 102 may occur using at least one of mechanical fasteners, adhesives, and metal bonding.

An embodiment of the present disclosure may use one or more of the above operations and other operations to provide a heat spreader 100 for use in a device to transfer heat from a component in the device. The use of such a heat spreader 100 may include the operations of positioning the heat spreader 100 in a first portion of the device, such as a top enclosure, such that a spring 104 on the heat spreader is aligned above a component 402 in the device, wherein the component is position in a bottom enclosure 410. The operations may also include applying a downward force on the top enclosure while it is aligned with the bottom enclosure such that corresponding force is exerted by the spring 104 onto the component, wherein the spring translates the downward force 104 into a horizontal force that results in an extension of the spring and a second downward force that results in a vertical deflection of the spring. The extension of the spring 104 results in an extension of the spring such that the tab slot 314 shifts from the second location to the third location, wherein while positioned at and transitioning between each of the second and third locations each tab slot 314 maintains physical contact with a corresponding tab 108 on the heat plate 102. Continuing to apply the downward force until the top enclosure is positioned relative to the bottom enclosure such that the device is in an assembled state. And, securing the top enclosure to the bottom enclosure. The securing of the top enclosure to the bottom enclosure may occur using any known methods and components.

The various embodiments of the present disclosure also provide for an assembled electronic device wherein heat from a component in such device is transferred by a heat spreader configured according to the above description.

Although various embodiments of the claimed invention have been described above with a certain degree of particularity, or with reference to one or more individual embodiments, those skilled in the art could make numerous alterations to the disclosed embodiments without departing from the spirit or scope of the claimed invention. The use of the terms "approximately" or "substantially" means that a value of an element has a parameter that is expected to be close to a stated value or position. However, as is well known in the art, there may be minor variations that prevent the values from being exactly as stated. Accordingly, anticipated variances, such as 10% differences, are reasonable variances that a person having ordinary skill in the art would expect and know are acceptable relative to a stated or ideal goal for one or more embodiments of the present disclosure. It is also to be appreciated that the terms "top" and "bottom", "left" and "right", "up" or "down", "first", "second", "before", "after", and other similar terms are used for description and ease of reference purposes only and are not intended to be limiting to any orientation or configuration of any elements or sequences of operations for the various embodiments of the present disclosure. Further, the terms "and" and "or" are not intended to be used in a limiting or expansive nature and cover any possible range of combinations of elements and operations of an embodiment of the present disclosure. Other embodiments are therefore contemplated. It is intended that all matter contained in the above description and shown in the accompanying drawings shall be interpreted as illustrative only of embodiments and not limiting. Changes in detail or structure may be made without departing from the basic elements of the invention as defined in the following claims.

What is claimed is:

1. A heat spreader, configured to operatively dissipate heat from a heat generating device component, comprising:
   a heat plate-comprising:
      a top surface including at least a first location, a second location, and a third location; and
   a spring comprising:
      a first spring member; and
      a second spring member;
      wherein the first spring member is attached to the heat plate at the first location;
      wherein the second spring member attaches the spring to the heat plate at the second location, when the spring is compressed by the heat generating device component; and
   wherein the second spring member attaches the spring to the heat plate at the third location, when the spring is not compressed by the heat generating device component.

2. The heat spreader of claim 1,
   wherein the heat plate further comprises:
      a first fastener; and
      a second fastener;
   wherein the first fastener first attaches the spring to the heat plate at the first location; and
   wherein the second fastener second attaches the spring to the heat plate between each of the second location and the third location.

3. The heat spreader of claim 1,
   wherein each of the second location and the third location are distinct locations above the top surface of the heat plate.

4. The heat spreader of claim 3,
   wherein the heat plate further comprises:
      a tab extending above the top surface and between the second location and the third location.

5. The heat spreader of claim 4,
   wherein the spring thermally couples the heat plate to the heat generating device component when the spring is operatively compressed and thermally decouples the heat plate from the heat generating device component when the spring is not operatively compressed.

6. The heat spreader of claim 1,
   wherein the spring further comprises:
      a top spring member, connecting the first spring member with the second spring member, comprising:
         a first connecting member; and
         a second connecting member.

7. The heat spreader of claim 6,
   wherein the first connecting member comprises:
      a first spring curvature which deflects when compressed;
   wherein the second connecting member comprises:
      a fourth spring curvature which extends when compressed.

8. A heat spreader, configured to operatively dissipate heat from a heat generating device component, comprising:
   a heat plate comprising:
      a top surface including at least a first location, a second location, and a third location; and
   a spring comprising:
      a first spring member attached to the heat plate at the first location; and
      a second spring member;
         wherein the second spring member attaches the spring to the heat plate at the second location, when the spring is compressed by the heat generating device component; and
         wherein the second spring member attaches the spring to the heat plate at the third location, when the spring is not compressed by the heat generating device component;
   wherein the heat plate further comprises a tab; and
   wherein the second spring member further comprises a tab slot configured to operatively accept the tab.

9. The heat spreader of claim 8,
   wherein the spring further comprises:
      a top spring member, connecting the first spring member with the second spring member, comprising:
         a first connecting member; and
         a second connecting member.

10. The heat spreader of claim 9,
    wherein the first connecting member comprises:
       a first spring curvature; and
       a second spring curvature.

11. The heat spreader of claim 10,
    wherein the first spring curvature deflects when compressed.

12. The heat spreader of claim 9,
    wherein the second connecting member comprises:
       a third spring curvature; and
       a fourth spring curvature.

13. The heat spreader of claim 12,
    wherein the fourth spring curvature extends when compressed.

14. The heat spreader of claim 8,
    wherein the spring thermally couples the heat plate to the heat generating device component when the spring is operatively compressed and thermally decouples the heat plate from the heat generating device component when the spring is not operatively compressed.

15. A heat spreader, configured to operatively dissipate heat from a heat generating device component, comprising:
    a heat plate comprising:
       a top surface including at least a first location, a second location, and a third location; and a spring comprising:
- a first spring member attached to the heat plate at the first location;
- a second spring member;
  - wherein the second spring member attaches the spring to the heat plate at the second location, when the spring is compressed by the heat generating device component; and
  - wherein the second spring member attaches the spring to the heat plate at the third location, when the spring is not compressed by the heat generating device component; and
- a top spring member, connecting the first spring member with the second spring member, comprising:
  - at least two ribs;

wherein, when the spring is operatively compressed by the heat generating device component,
- the at least two ribs operatively contact a top surface of the heat generating device component, and
- the spring thermally couples the heat plate to the heat generating device component.

16. The heat spreader of claim 15,
wherein the top spring member further comprises:
  a first connecting member comprising a first spring curvature and a second spring curvature.

17. The heat spreader of claim 16,
wherein the top spring member further comprises:
  a second connecting member comprising a third spring curvature and a fourth spring curvature.

18. The heat spreader of claim 17,
wherein at least one of the first spring curvature and the third spring curvature deflects when compressed.

19. The heat spreader of 17,
wherein at least one of the second spring curvature and the fourth spring curvature extends when compressed.

20. The heat spreader of claim 15,
wherein the spring thermally couples the heat plate to the heat generating device component when the spring is operatively compressed and thermally decouples the heat plate from the heat generating device component when the spring is not operatively compressed.

* * * * *